(12) United States Patent
Parker

(10) Patent No.: US 7,068,039 B2
(45) Date of Patent: Jun. 27, 2006

(54) TEST STRUCTURE EMBEDDED IN A SHIPPING AND HANDLING COVER FOR INTEGRATED CIRCUIT SOCKETS AND METHOD FOR TESTING INTEGRATED CIRCUIT SOCKETS AND CIRCUIT ASSEMBLIES UTILIZING SAME

(75) Inventor: Kenneth P. Parker, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/834,449

(22) Filed: Apr. 28, 2004

(65) Prior Publication Data

US 2005/0242823 A1   Nov. 3, 2005

(51) Int. Cl.
*G01R 31/28* (2006.01)
(52) U.S. Cl. ...................... 324/519; 324/530
(58) Field of Classification Search ............... 324/530, 324/537, 756, 73.1, 761–765, 158.1, 755; 257/701; 361/220, 212
See application file for complete search history.

(56) References Cited

U.S. PATENT DOCUMENTS

| | | | |
|---|---|---|---|
| 557,209 A | | 2/1896 | Kephart |
| 3,906,363 A | * | 9/1975 | Fowler ..................... 324/537 |
| 5,067,007 A | * | 11/1991 | Otsuka et al. .............. 257/701 |
| 5,420,500 A | | 5/1995 | Kerschner |
| 5,498,964 A | | 3/1996 | Kerschner et al. |
| 5,557,209 A | | 9/1996 | Crook et al. |
| 6,316,949 B1 | * | 11/2001 | Yamashita .................. 324/683 |
| 6,335,629 B1 | * | 1/2002 | Lee et al. .................... 324/755 |
| 6,861,863 B1 | * | 3/2005 | Ishioka et al. .............. 324/763 |
| 2002/0140445 A1 | | 10/2002 | Ishioka et al. |
| 2003/0092305 A1 | | 5/2003 | Guss et al. |

OTHER PUBLICATIONS

EP 0653642 A1, date of publication of application: May 17, 2005, David T Crook, System for measuring the integrity of an electrical contact.
EP 0805356 A3, Date of publication: Apr. 22, 1998, Kenneth P Parker, et al, Integrated or intrapackage capability for testing electrical continuity between an integrated circuit and other circuitry.
WO 99/18447, International Publication Date: Apr. 15, 1999, James E Johnson, et al Burn-in board with adaptable heat sink device.

* cited by examiner

*Primary Examiner*—Vincent Q. Nguyen

(57) ABSTRACT

A device for enabling testing of electrical paths through a circuit assembly is presented. The device may include a test facilitating shipping and handling cover for a socket of the circuit assembly. The test facilitating shipping and handling cover may have a conductive layer for capacitively coupling to an array of pins in the socket during testing. A method for testing continuity of electrical paths through a circuit assembly is presented. In the method, one or more nodes of the circuit assembly are stimulated, contacts of a socket on the circuit assembly are capacitively coupled with a conductive layer of a shipping and handling cover mated with the socket, and an electrical characteristic is measured by a tester coupled to the shipping and handling cover to determine continuity of electrical paths through the circuit assembly.

6 Claims, 11 Drawing Sheets

TEST STRUCTURE EMBEDDED IN A SHIPPING AND HANDLING COVER FOR INTEGRATED CIRCUIT SOCKETS AND METHOD FOR TESTING INTEGRATED CIRCUIT SOCKETS AND CIRCUIT ASSEMBLIES UTILIZING SAME

BACKGROUND OF THE INVENTION

During manufacture, circuit assemblies (e.g., printed circuit boards and Multi-Chip Modules) need to be tested for interconnect defects such as open solder joints, broken connectors, and bent or misaligned leads (e.g., pins, balls, or spring contacts). One way to test for such defects is via capacitive lead-frame testing. FIGS. 1 & 2 illustrate an exemplary setup for capacitive lead-frame testing. FIG. 1 illustrates a circuit assembly 100 comprising an integrated circuit (IC) package 102 and a printed circuit board 104. Enclosed within the IC package is an IC 106. The IC is bonded to the leads 108, 110 of a lead-frame via a plurality of bond wires 112, 114. The leads, in turn, are meant to be soldered to conductive traces on the printed circuit board. Note, however, that one of the leads 108 is not soldered to the printed circuit board, thereby resulting in an "open" defect.

Positioned above the IC package 102 is a capacitive lead-frame test assembly 116. The exemplary test assembly 116 shown comprises a sense plate 118, a ground plane 120, and a buffer 122. The test assembly is coupled to an alternating current (AC) detector 124. A first, grounded test probe, TP_1, is coupled to lead 110 of the IC package. A second test probe, TP_2, is coupled to lead 108 of the IC package. The second test probe is also coupled to an AC source 126.

FIG. 2 shows an equivalent circuit for the apparatus shown in FIG. 1. In the equivalent circuit, $C_{sense}$ is the capacitance seen between the sense plate 118 and the lead 108 being sensed, and $C_{Joint}$ is the capacitance seen between the lead 108 and the conductive trace (on the printed circuit board) to which the lead is supposed to be soldered. The switch, S, represents the quality of the lead being tested. If the lead being tested is good, switch S is closed, and the capacitance seen by the AC detector is $C_{sense}$. If the lead being tested is bad, switch S is open, and the capacitance seen by the AC detector is $C_{sense}*C_{Joint}/(C_{Sense}+C_{Joint})$. If $C_{sense}$ is chosen to be significantly larger than any possible $C_{Joint}$, a bad lead will result in the AC detector seeing a capacitance near $C_{Joint}$. As a result, the AC detector must have sufficient resolution to distinguish $C_{sense}$ from $C_{Joint}$.

Additional and more detailed explanations of capacitive lead-frame testing are found in U.S. Pat. No. 5,557,209 of Crook et al. entitled "Identification of Pin-Open Faults by Capacitive Coupling Through the Integrated Circuit Package", and in U.S. Pat. No. 5,498,964 of Kerschner entitled "Capacitive Electrode System for Detecting Open Solder Joints in Printed Circuit Assemblies".

Over the years, various factors have interfered with the success of capacitive lead-frame testing. One factor is a lack of capacitive coupling between an IC lead-frame and a tester's sense plate. This problem is largely traced to the on-going miniaturization of IC packages and their lead-frames, as well as the imposition of ground shield and heat sinks between lead-frames and the sensor plate (some of which are internal to an IC's package). The miniaturization of lead-frames is also exacerbated by "area connection" packages. In an area connection package, the package's lead-frame is laid out as an array on a surface of the package, rather than in rows along the edges of the package. Examples of package area connections include ball grid arrays (BGAs; a lead-frame comprising a plurality of solder balls on a surface of a package) and land grid arrays (LGAs; a lead-frame comprising a plurality of stenciled or screened contact pads on a surface of a package). Area connection packages can be advantageous in that they often minimize the lengths of signal traces coupling a package's IC to its lead-frame. However, they can also interfere with capacitive lead-frame testing in that they sometimes make it difficult to position the sense plate of a capacitive lead-frame tester in close enough proximity to their lead-frames.

One way to address some of the problems of IC miniaturization is disclosed in U.S. Pat. No. 6,087,842 of Parker et al. entitled "Integrated or Intrapackage Capability for Testing Electrical Continuity Between an Integrated Circuit and Other Circuitry". This patent teaches the placement of a capacitive sensor interior to an IC package. If the placement of such sensor is carefully chosen, the capacitive coupling between the sensor and a package's lead-frame can be increased—in part because the interior placement of the capacitive sensor can circumvent shielding and heat dissipation structures of the IC package.

Another factor that has interfered with the success of capacitive lead-frame testing is the ratio of non-signal leads to total leads on an IC package. As ICs have become more complex and operate at higher frequencies, the ratio of non-signal leads as a fraction of total leads has increased. Typically, the non-signal leads supply power and ground connections, and are redundantly connected in parallel (either on a printed circuit board, within an IC package, or within an IC itself). Capacitive lead-frame testing is not designed to detect opens on such leads. Thus, a significant fraction of IC leads could suffer from opens that cannot be tested.

Yet another factor that has interfered with the success of capacitive lead-frame testing is socket-mounted IC packages. These packages do not mount directly to a board, but are mounted in sockets that allow them to be added or replaced after a board is manufactured. This adds a layer of complexity to testing in that proper connection between the board and package requires proper connection between the board and socket. If the package is placed in the socket, both sets of connections (i.e., between board and package, and between board and socket) can be tested at once via In-Circuit test, Boundary-Scan test, capacitive lead-frame test, and so on. However, all of these techniques depend on the inserted device's inherent testability for opens coverage; and even if the inserted device is suited to application of these techniques, only signal leads will be adequately tested, and redundant power and ground connections will only be "grossly" tested. If the inserted device has poor testability, neither the inserted device nor the socket will be adequately tested. Also, sockets are easily damaged, so there are opportunities to damage a socket that must be minimized during manufacture, shipping, handling, attachment to the printed circuit board, testing or during insertion of the IC into the socket.

Accordingly, there is a need for a method and apparatus to test integrated circuit sockets that minimizes the risk of damaging the socket, reduces testing and handling costs, and increases testing and handling throughput.

SUMMARY OF THE INVENTION

A device enabling testing continuities of electrical paths through a circuit assembly is presented. The device may comprise a test facilitating shipping and handling cover for a socket of the circuit assembly. The test facilitating shipping and handling cover may have a conductive layer for capacitively coupling with an array of pins within the socket during testing.

A method testing continuity of electrical paths through a circuit assembly is presented. The method may comprise stimulating one or more nodes of the circuit assembly, capacitively coupling with a conductive layer of the test facilitating shipping and handling cover mated to a socket of the circuit assembly, measuring an electrical characteristic of the circuit assembly with a tester coupled to the shipping and handling cover to determine continuity of electrical paths through the circuit assembly.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
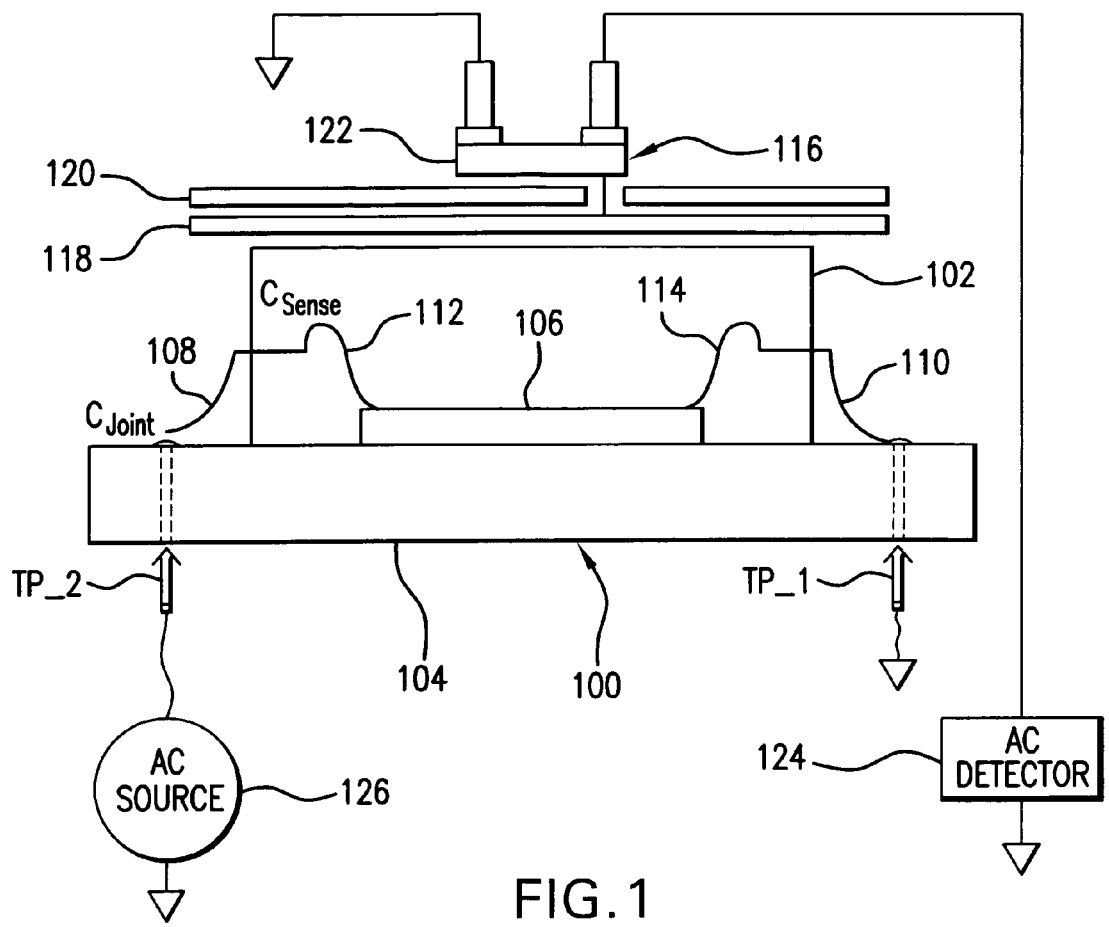
FIG. 1 illustrates an exemplary set-up for capacitive lead-frame testing.
Figure 2:
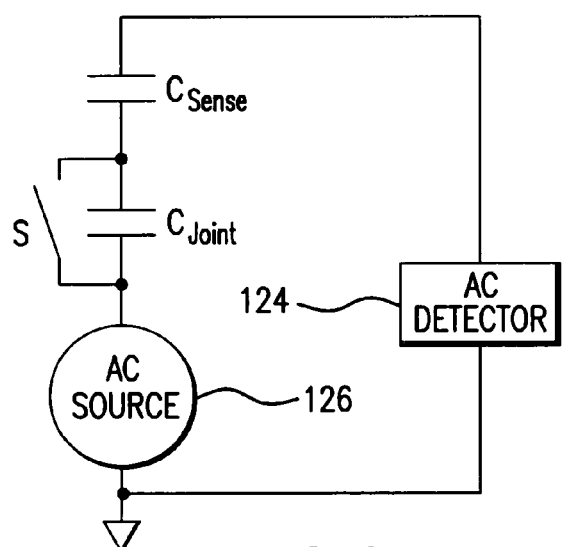
FIG. 2 illustrates an exemplary circuit for capacitive lead-frame testing.
Figure 3:
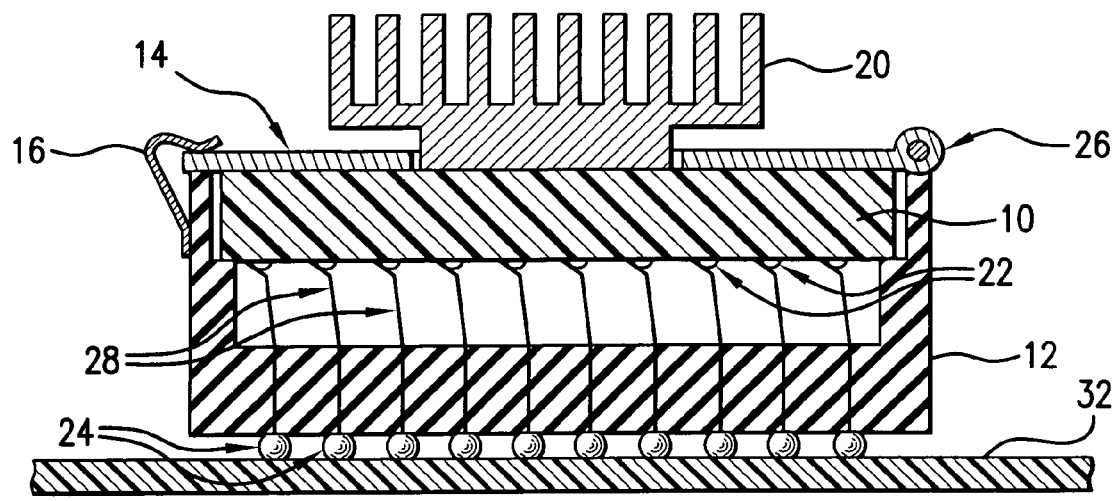
FIG. 3 illustrates a side, cut-away view of an exemplary integrated circuit socket with an integrated circuit housed therein.
Figure 4:
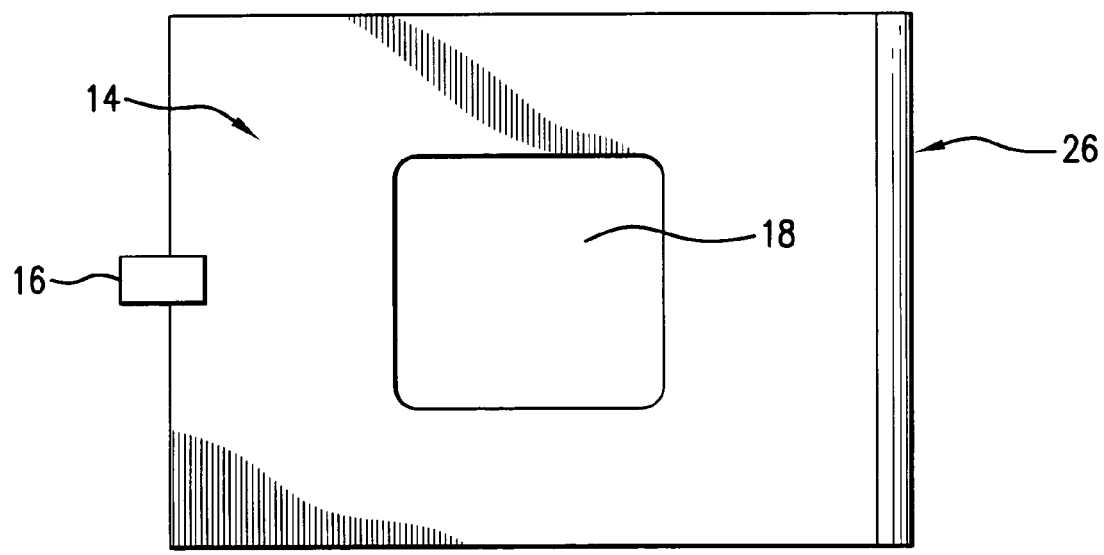
FIG. 4 illustrates a top view of an exemplary integrated circuit socket.

Some complex integrated circuits are not directly mounted on boards, but are intended to reside in sockets that permit them to be added or replaced after a board is manufactured. An exemplary IC mounted to a board via a socket connector is illustrated in FIGS. 3 and 4, in which an IC 10 is secured in a socket base 12 by means on a lid or clamp plate 14 and a clamp or lock 16. The IC 10 is clamped or locked into place within the socket 12 by a clamp plate 14, which depresses the IC 10 onto a field of contact pin spring fingers 28 that map one-to-one to solder balls (or pins) 24 on the bottom of the socket 12, as shown in FIG. 3. The IC 10 may make electrical contact with a board (not shown) via hundreds or thousands of delicate pin spring fingers 28. The IC 10 may have an array of pads, pins, solder balls or solder columns 22 that come into physical and electrical contact with individual pin spring fingers 28, which map to an array of pads, pins, solder balls or solder columns 24 that are attached to traces, pads or other contact points on the board (not shown).

As seen in the top view of FIG. 4, the socket lid or clamp plate 14 may have a window or access hole 18 to permit a detachable heat sink 20 to be attached to the IC 10 after it is secured within the socket base 12. The heat sink 20 may be connected to the IC 10 through the access hole 18 in the clamp plate 14. If an installed IC 10 must later be removed, the heat sink 20 is removed first to enable movement of the clamp plate 14. The clamp plate 14 may be hinged on one side with a hinge 26 and clamped on one or more sides with one or more clamps 16 or it may be clamped on two or more sides 26.

Figure 5:
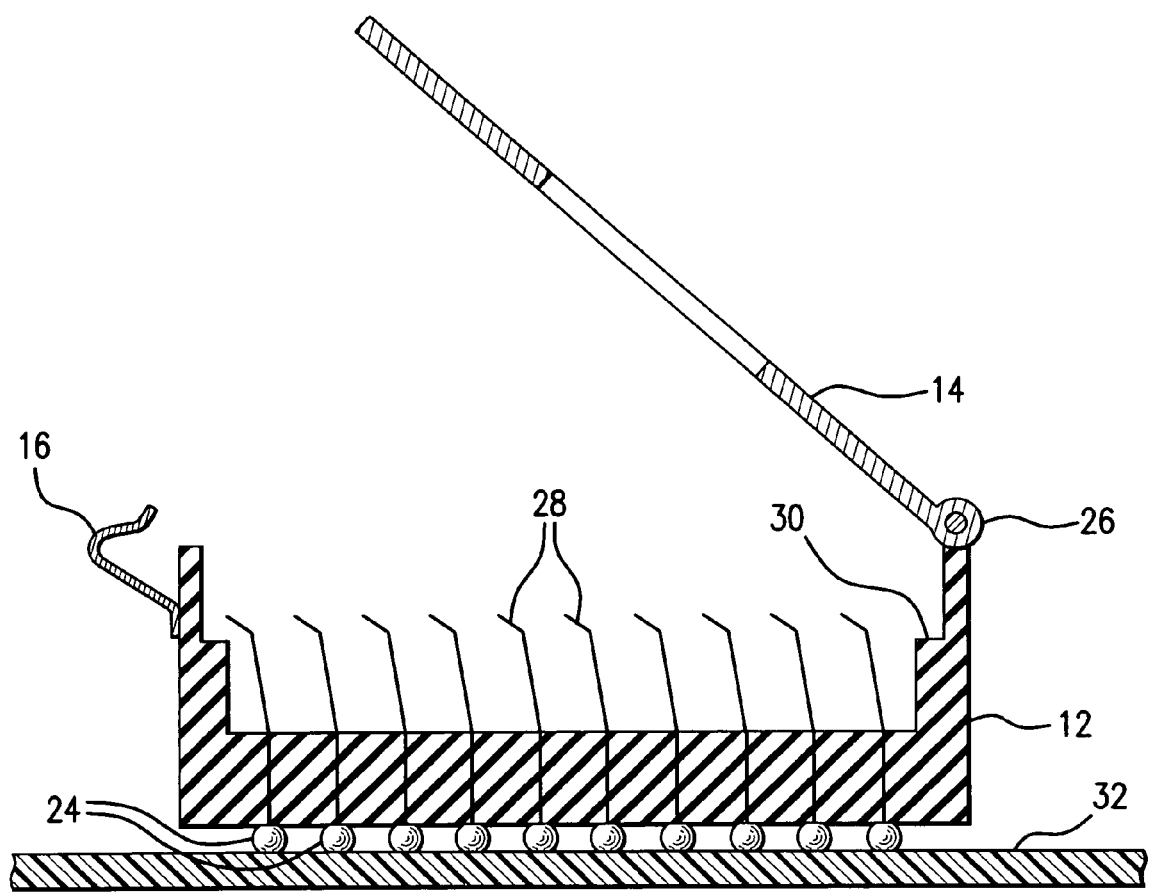
FIG. 5 illustrates a side, cut-away view of an unlocked, empty integrated circuit socket mounted on a circuit assembly.
Figure 6:
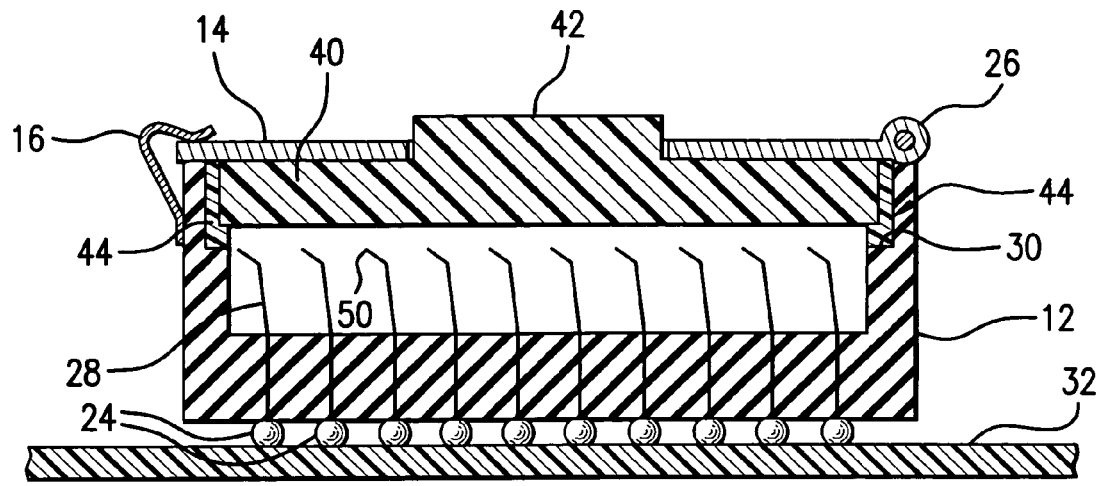
FIG. 6 illustrates a side, cut-away view of an exemplary integrated circuit socket with a shipping and handling cover housed therein.
Figure 7:
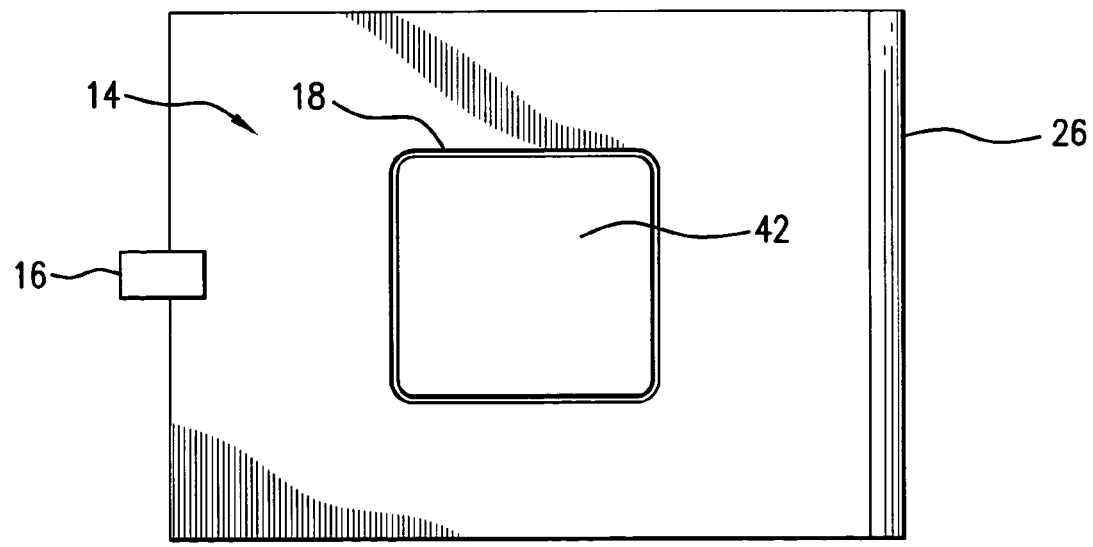
FIG. 7 illustrates a top view of an exemplary integrated circuit socket with a shipping and handling cover housed therein.

FIG. 5 shows an empty, unlocked IC socket 12 with clamp plate 14, clamp 16, spring pin fingers 28, spacing ledge 30 and solder balls 24 for attaching the socket 12 to electrical contacts on a printed circuit board 32. A socket 12 containing hundreds or thousands of delicate pin spring fingers 28 is liable for damage or contamination during shipping and handling and board assembly, so empty sockets as shown in FIG. 5 needs to be protected. This is generally accomplished by inserting an inexpensive, (e.g., plastic) shipping and handling cover 40 into the socket 12, as shown in FIGS. 6 and 7, before it leaves the socket manufacturer. The shipping and handling cover 40 is clamped into place over, but not touching the fragile spring pin fingers 28. A spacing flange 44 on the shipping and handling cover 40 engages with spacing ledge 30 of the socket 12 to ensure that the shipping and handling cover does not touch or damage the spring pin fingers 28. The spring pin fingers 28 are therefore not under tension during shipping, handling and attachment of the socket 12 to the circuit board.

The shipping and handling cover 40 has a pick-and-place target 42 that protrudes through aperture 18 of the clamp plate 14. A placement machine positions the socket 12 onto the circuit board 32 during attachment uses the pick-and-place target 42. After the socket 12 is attached to the board 32, it is important to determine whether the socket 12 is satisfactorily attached to the board 32, in particular, are all of its connections (power and ground included) attached to the board 32.

The United States patent application of Kenneth P. Parker, et al. entitled "Methods and Apparatus for Testing Continuity of Electrical Paths Through Connectors of Circuit Assemblies", USPTO Ser. No. 10/683,693, filed Oct. 9, 2003, is hereby incorporated by reference and discloses how to determine whether defects exist in one or more of a plurality of electrical paths through a socket or other connector.

Figure 8:
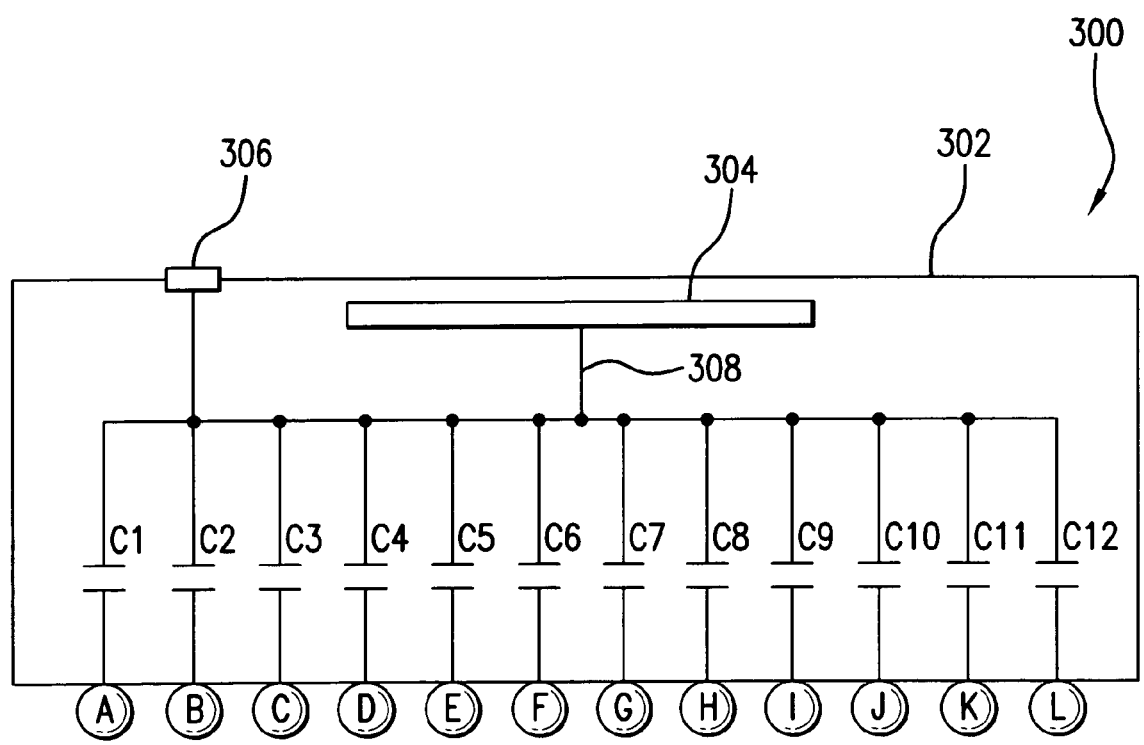
FIG. 8 illustrates an exemplary embodiment of a device for testing continuity of electrical paths through circuit assemblies with sockets.

One exemplary apparatus disclosed in the afore-mentioned patent application is shown in FIG. 8, which illustrates a first exemplary embodiment of a device 300 for testing continuity of electrical paths through a socket of a circuit assembly. The device 300 comprising a package 302 containing incomplete or no mission circuitry for the circuit assembly of which the socket under test forms a part. If the device contains no mission circuitry, the device 300 may be produced based on the structural design of the socket, and without any knowledge of the functional design of the circuit assembly.

The package 302 is provided with a plurality of contacts (identified as contacts A–L) for mating with contacts of the socket under test. These contacts may be similar to the socket pins 28 of socket 12 in FIGS. 3–7. As shown in FIG. 8, the contacts on the package may comprise solder balls of a ball grid array (BGA). The contacts could also take the form of a land grid array (LGA), pins, or other forms of contacts (e.g., PBGA, TBGA, CBGA, CCGA, CLGA, HiTCE, or organic/laminate contacts).

A test sensor port integrated with the package 302 may take one or more of a plurality of forms. For example, as shown in FIG. 8, the test sensor port could comprise one or both of a capacitor plate 304 and an ohmic contact 306. If the test sensor port comprises a capacitor plate, the plate could take the form of an external capacitor plate or, as shown, a capacitor plate 304 that is enclosed within the package 302 so that it may be coupled to using the package 302 as a dielectric.

Integrated with (and possibly enclosed within) the package 302 is a plurality of passive circuit components (identified as capacitors C1–C12) that are coupled in parallel between ones of the plurality of contacts A–L on the package 302 and the test sensor port 304, 306. In FIG. 8, the passive circuit components are shown to be capacitors, each of which is coupled between a different one of the package contacts and a common internal circuit node 308. However, these passive circuit components could take other forms, such as resistors R1–R12.

In the device embodiment shown in FIG. 8, the values of the parallel capacitors C1–C12 are substantially matched. That is, the relative variation between the capacitors (or error $\in$) is kept to a small value, such as 0.5%. So long as the error $\in$ is small and the value that the capacitors approach is small compared to the normal values of capacitance between contacts of a socket under test, the actual value that the capacitors approach need not be closely controlled. Thus, for example, if the normal values of capacitance between contacts of a socket under test are around one picoFarad (pF), the value that the parallel capacitors approach may be 15 femtoFarads (fF) ±0.25%, or alternatively, 14.5 fF ±0.25%. Modeling considerations, however, may require keeping the values of the parallel capacitors within some sort of desired value (e.g., 15 fF ±5%). The values of the parallel capacitors may be kept small compared to the normal values of connector capacitance so that insertion of the device 300 into a socket under test will not add significant additional capacitance between contacts one the socket, which may be an important factor for some tests of a circuit assembly.

When the device 300 is mated to a socket having a plurality of electrically coupled contacts A–L (e.g., a socket having redundant ground contacts), stimulation of the electrically coupled contacts should result in a capacitance of N*C being seen at the test sensor port (where N is the number of redundant contacts of the connector, and C is the value of each of the device's parallel capacitors). If there is an open in one of the paths through the redundant contacts, then the capacitance seen at the test sensor port will be (N−1)*C, with further reductions in capacitance being attributed to additional opens.

An unresolved question, however, is, "If a defect exists, where is the defect in relation to the redundant contacts?" Although the afore-mentioned patent application "693 discloses how to diagnose the locations of defects using intersecting sets of capacitors, an improved means for diagnosing the locations of defects would be desirable.

The United States patent application of Kenneth P. Parker, et al. entitled "methods and Apparatus for Diagnosing Defect Locations In Electrical Paths of Connectors of Circuit Assemblies", USPTO Ser. No. 10/703,944, filed Nov. 6, 2003, is hereby incorporated by reference and discloses how to diagnose the locations of defects by using coupling capacitances to couple one or more pairs of connector contacts.

Figure 9:
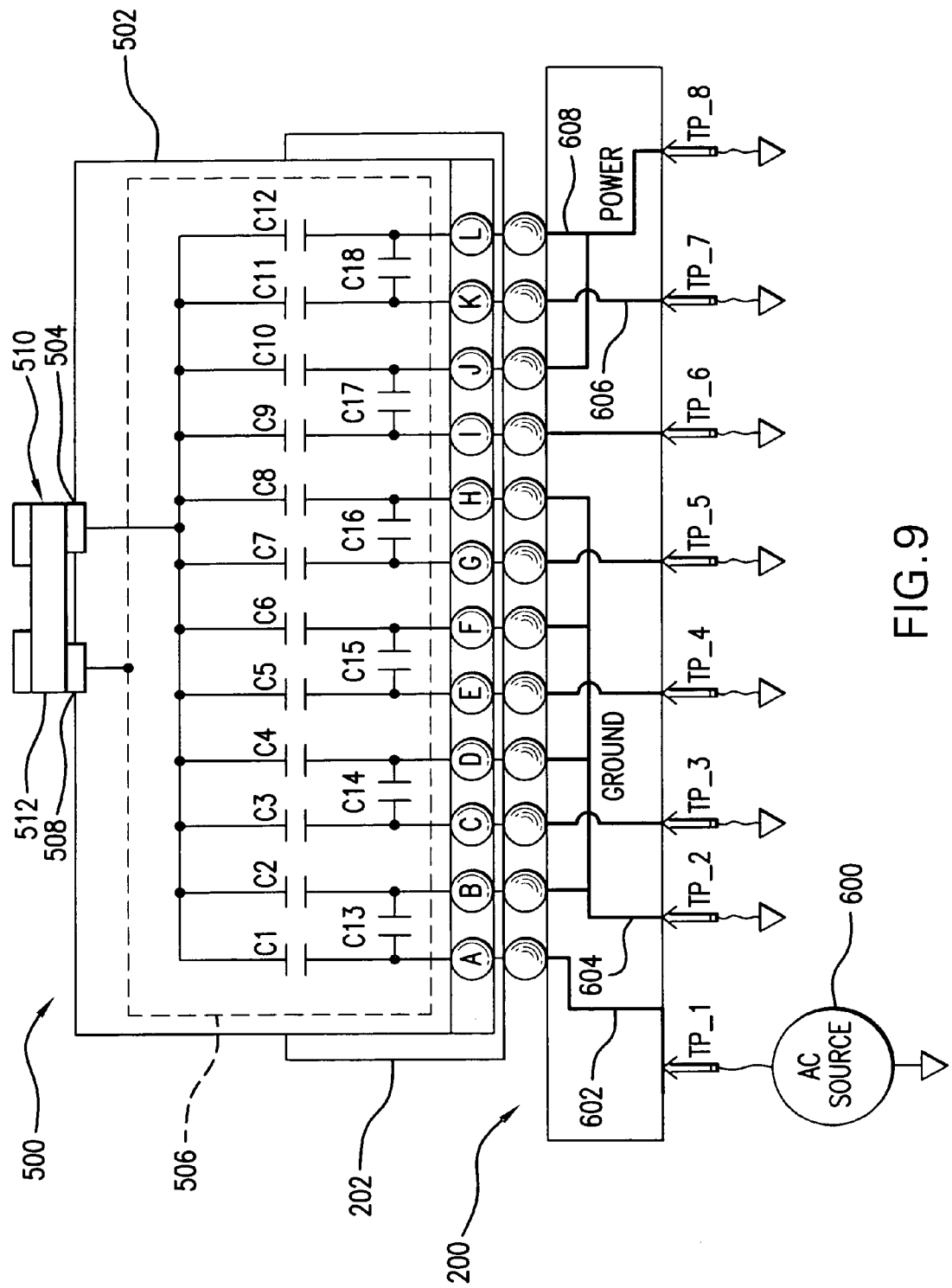
FIG. 9 illustrates an exemplary embodiment of a device for testing continuity of electrical paths through a circuit assembly mated with a socket, with a capacitive lead-frame test assembly coupled to the device.
Figure 10:
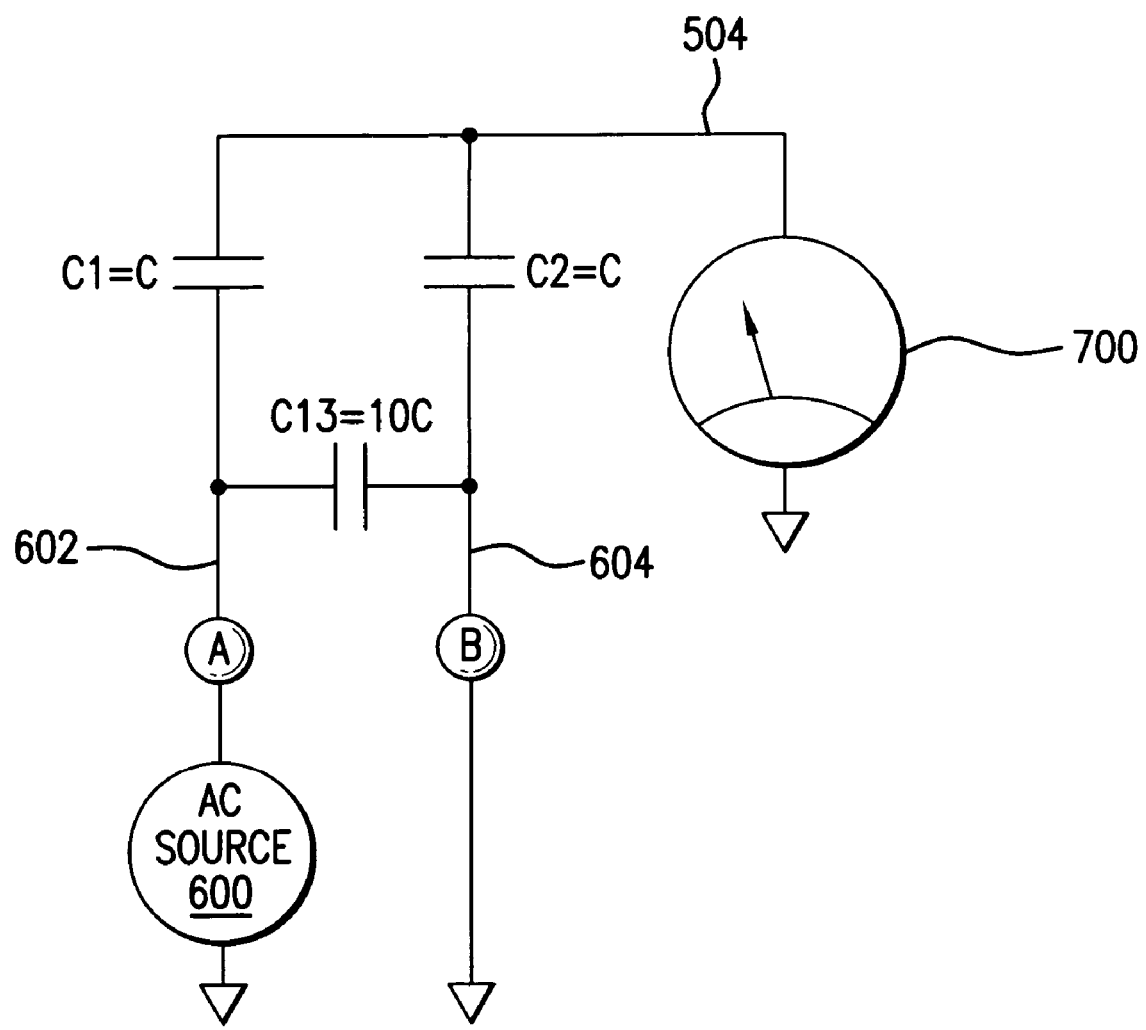
FIG. 10 illustrates an equivalent circuit for the FIG. 9 apparatus during one portion of a test.
Figure 11:
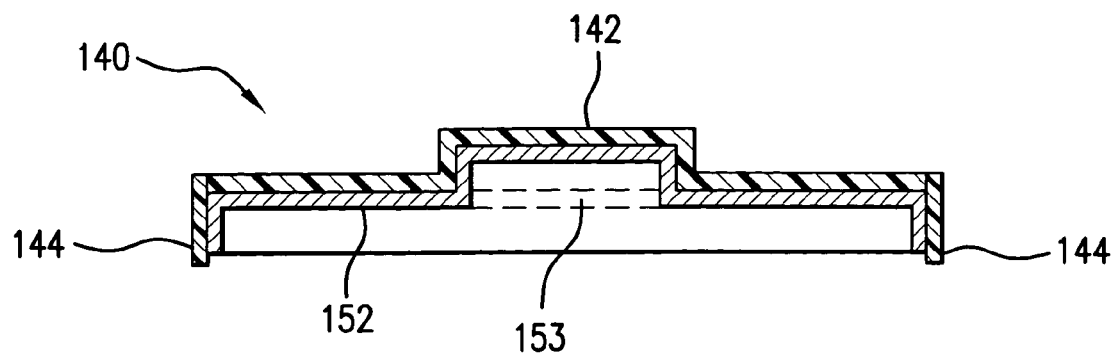
FIG. 11 illustrates a side, cut-away view of an exemplary embodiment of a shipping and handling cover with a conductive layer for capacitive testing.

The method in the '944 patent application is shown in an exemplary embodiment in FIGS. 10 and 11. The method and device 500 of the '944 application is similar to the method and device 300 of the '693 application having a package 502, an ohmic contact 508, test sensor port 504, and a plurality of capacitors C1–C1 coupled in parallel between a plurality of contacts A–L on the package 502 and the test sensor port 504. The '944 application includes a second plurality of passive circuit components (capacitors C13–C18) is also integrated with (and possibly enclosed within) the package 502. Ones of the second plurality of passive circuit components are coupled between ones of the plurality of contacts on the package. For example, capacitor C13 is coupled between contacts A and B. Although the passive circuit components of the second plurality are shown in FIG. 9 to be capacitors, they could take other forms, such as resistors.

To prevent the passive circuit components of the device 500 from picking up stray capacitance from a circuit assembly under test, a ground shield 506 may surround the components. The ground shield 506 may have holes therein through which component contacts and other signal wires may be routed. The ground shield 506 may be variously configured, but in one embodiment comprises upper and lower ground planes coupled by a number of conductive vias.

By way of example, the test sensor port of the device 500 may comprise an ohmic contact 508 for coupling to the ground shield 506. In this manor, a capacitive lead-frame test assembly 510 may couple the ground shield 506 to signal ground while reading the capacitance (or other electrical characteristic) of the device 500 at contact 504.

Assume now that the device 500, configured as described in the above paragraphs, is used to test a circuit assembly 200. To prepare for test, the device 500 is mated to a socket 202 of the circuit assembly 200, as shown in FIG. 9. A capacitive lead-frame test assembly 510 is then coupled to the test sensor port 504 of the device 500. As shown, the capacitive lead-frame assembly 510 may comprise a buffer 512.

Those nodes of the circuit assembly 200 that are coupled to contacts A–L of the socket under test 202 are coupled to a number of test probes (e.g., probes TP_1, TP_2, TP_3, TP_4, TP_5, TP_6, TP_7 and TP_8). For contacts of the socket 202 that are ganged together (e.g., contacts B, D, F & H which are coupled to GROUND, and contacts J & L which are coupled to POWER), only a single test probe need be coupled to the ganged node. By way of example, the test probes shown in FIG. 9 could be included in a "bed of nails" test fixture.

After preparing the circuit assembly 200 for test, one or more nodes of the circuit assembly 200 are stimulated (e.g., via an AC signal source 600) while other nodes of the circuit assembly are preferably grounded (to reduce noise and extraneous signal pickup). An exemplary test sequence might then commence with the stimulation of node 602 while all other nodes (e.g., nodes 604–608) of the circuit assembly 200 are grounded.

At this point of the test, and assuming that the values of capacitors C1, C2 and C13 are: C1=C, C2=C, and C13=10C, the apparatus shown in FIG. 9 may be reduced to the equivalent circuit shown in FIG. 10.

If the socket 202 is in good condition, and is properly coupled to node 602, then node 602 should be shorted to contact A of the device 500, and node 604 should be shorted to contact B of the device 500. Given that the potential at contact B is zero, the capacitance seen at port 504 should be equal to C±∈. By way of example, the capacitance seen at port 504 may be derived by measuring the current flow through port 504 using a meter 700.

Assume now that the socket 202 is faulty, or is not properly coupled to node 602, such that an open exists between node 602 and contact A. This open will result in a small capacitance being placed in series with capacitor C1, thus reducing the capacitance seen at port 504. For example, if the value of C is 15 fF, and the capacitance contributed by the open is 1 fF, then the capacitance seen at port 504 will be approximately 0.94 fF. This change in the capacitance seen at node 504 (from 15 fF to 0.94 fF), if detectable by the sensitivity of the capacitive lead-frame sensor 510 (and if greater than ∈) can be used to determine that an open exists in the electrical path of contact A.

Now assume that the socket 202 is faulty, or is not properly coupled to node 604, such that an open exists between node 604 and contact B. With contact B ungrounded, coupling capacitance C13 is now placed in series with capacitance C2. If C13 is much larger than C2 (e.g., an order of magnitude larger, as shown in FIG. 10), then the capacitance seen at port 504 will be approximately C1+C2 (or 2*C in FIG. 10).

Finally, assume that the socket 202 is faulty, or is not properly coupled to both of nodes 602 and 604, such that opens exist in the electrical paths of both contacts A and B. In this case, the capacitance seen at port 504 should be near zero. Thus, if there is an open in the electrical path of contact A, it is difficult to assess whether there is also an open in the electrical path of contact B. However, stimulation of node 602 alone does allow the device 500 to provide a means for diagnosing whether an open exists in the electrical path of contact A "or" contact B.

A test of the circuit assembly 200 may continue with the stimulation of node 604 while all other nodes are grounded. Note that node 604 is a ground plane that electrically couples contacts B, D, F & H of the device 500. If the socket 202 is in good condition, and is properly coupled to node 604, then node 604 should be shorted to contacts B, D, F & H of the device, and the capacitance seen at port 504 should be equal to 4C±4∈ (assuming that the values of capacitors C1–C12 are all equal to C).

Assume now that the socket 202 is faulty, or is not properly coupled to node 604, such that one or more opens exist between node 604 and ones of contacts B, D, F and H. For each open, the capacitance seen at port 504 will be reduced. For example, if there is an open between node 604 and contact B, the capacitance seen at port 504 will be reduced by roughly the value of capacitor C2.

Similarly to the way in which the continuity of the electrical path of contact B can be evaluated while stimulating node 602, the continuity of the electrical paths of contacts A, C, E & G can be evaluated, to a degree, while stimulating node 604.

A test of the circuit assembly 200 may continue with sequential stimulation of the nodes connected to probes TP_3–TP_8.

While it was previously indicated that a defect in the electrical path of contact A would result in diagnostic ambiguity as to whether the electrical path of contact B was also faulty, diagnostic results achieved from the sequential stimulation of a plurality of nodes can be variously compared to possibly remove a diagnostic ambiguity. Furthermore, the evaluation of a plurality of diagnostic results can enable one to determine whether a defect in a super node (such as a power or ground plane) is in the vicinity of a particular contact of the device 500, or more in the vicinity of a particular test probe (i.e., such that the defect is noted at a plurality of contacts of the device 500.

While the devices and methods of applications '693 and '944 provide exemplary methods for testing a socket and its connectivity with a circuit assembly, these solutions increase the opportunity to damage the delicate socket, especially the socket pins 28. As noted previously with reference to FIGS. 3–7, typically, a handling cover 40 is inserted into the socket 12 after manufacture and is intended to protect the socket pins 28 from damage and contamination from the time the socket 12, 202 is manufactured, during placement on the circuit assembly 32, 200; through soldering or other means of attachment; through processing, assembly and attachment of other components on the circuit assembly; and during shipping and handling, until the integrated circuit 10 is finally inserted into the socket 12, 202.

The testing techniques of the above applications '693 and '944 require placing a capacitive sense plate device 300, 500 in ohmic contact or close proximity (for capacitive coupling) with socket pins 28 of socket 12, 202. The requirement for ohmic contact or close proximity cannot be satisfied if the socket 12, 202 is mated with a typical shipping and handling cover 40. Thus, heretofore, these techniques have required the shipping and handling cover 40 to be removed; the capacitive sense plate device 300, 500 to be then inserted into the socket 12, 202 (and potentially physical contact with pins 28); the socket testing to then be run; the capacitive sense plate device 300, 500 to be removed from the socket 12, 202; and the shipping and handling cover 40 to be replace into the socket 12, 202 for further handling until such time as the intended integrated circuit 10 is finally placed in the socket 12, 202.

The act of removing the shipping and handling cover 40, performing the test with a test sensor device 300, 500 in physical contact (ohmic coupling) or close proximity (capacitive couplings to socket pins 28, and then replacing the shipping and handling cover 40 presents risk of socket or socket pin 28 damage, as well as increasing handling time which reduces test throughput and raises costs. If the socket could be tested without removing the shipping and handling cover, without inserting an additional testing device 300, 500 and without physically touching socket pins 28, then reduction in risk of socket damage, parts costs, labor, and testing and handling time could be realized.

Figure 12:
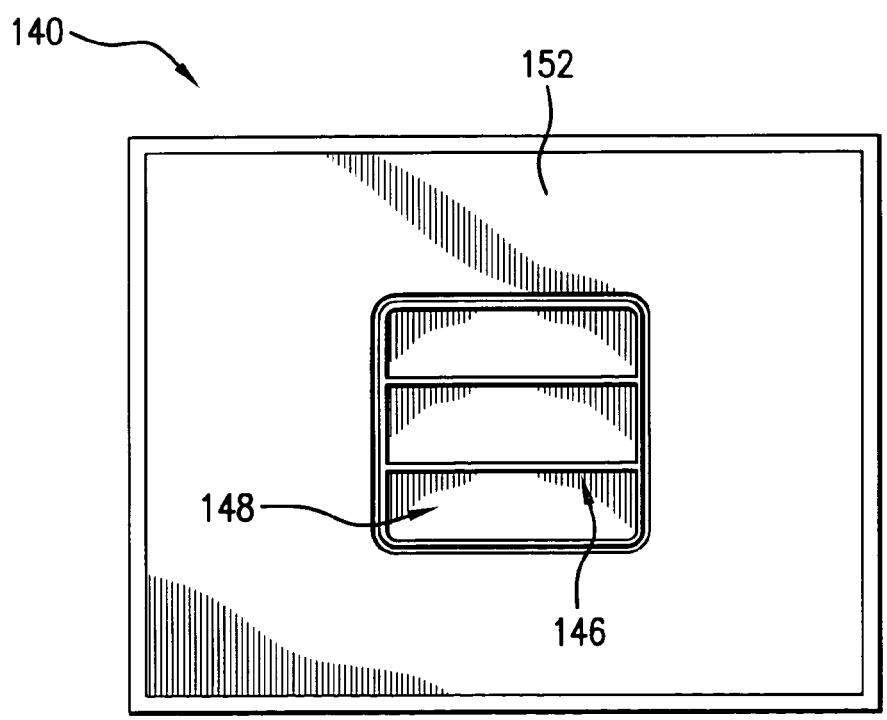
FIG. 12 illustrates a bottom view of a shipping and handling cover with a conductive layer for capacitive testing.

A testable shipping and handling cover. 140 is shown in FIGS. 11 and 12, which may be a simple, inexpensive piece of injection-molded plastic, or other inexpensive, simply manufactured dielectric material. The raised pick-and-place target 142 may be hollowed out 148, as shown in bottom view of FIG. 12 with some number of reinforcement trusses 146 left in for strength.

The testable shipping and handling cover 140 may be modified to support capacitive testing techniques as described and taught above and in applications '693 and '944. The under side of the shipping and handling cover 140 may be coated with a conductive coating 152 of a substantially uniform thickness. The conductive coating may be applied to the cover 140 by spraying, brushing or anodizing conductive paint onto the bottom side of shipping and handling cover 140. The thickness of the conductive layer 152 may be selected based on the geometries of a particular socket being tested. For example, the spacing between the top of the socket pins and the underside of the shipping and handling cover, the desired sense capacitance and the pin-to-pin capacitance between the pins of a particular socket being tested.

The conductance in ohm/square need only be sufficient to form small capacitors (e.g., 15–30 fF), which have considerable impedance themselves. The insertion of a few 1000's of ohms series impedance due to the coating 152 will have negligible effect on the measurements made. The spacing flanges 144 determine the plate separation of the socket pins sense capacitors, where the end of the socket pin 150 is the bottom plate, and the coating 152 on the underside of the shipping and handling cover 140 is the common top plate.

If a testable shipping and handling cover is manufactured from scratch, rather than applying a conductive layer to an off the shelf cover, the spacing flanges may be designed, so that the coating 152 is spaced approximately 20–50 mils above the tops of the socket pins 50 to create sense capacitors in the 15–30 fF range. The top of the pick-and-place target 142 is sized to enable ease of handling of the socket 12 during manufacturing, testing, shipping and handling by automated equipment or handlers. The hollowed out region 148 under the pick-and-place target 142 may be decreased or modified in size and shape or eliminated at 153 to assure close proximity between the conductive coating 152 and the top of socket pins 150 to enable capacitive coupling there between.

Figure 13:
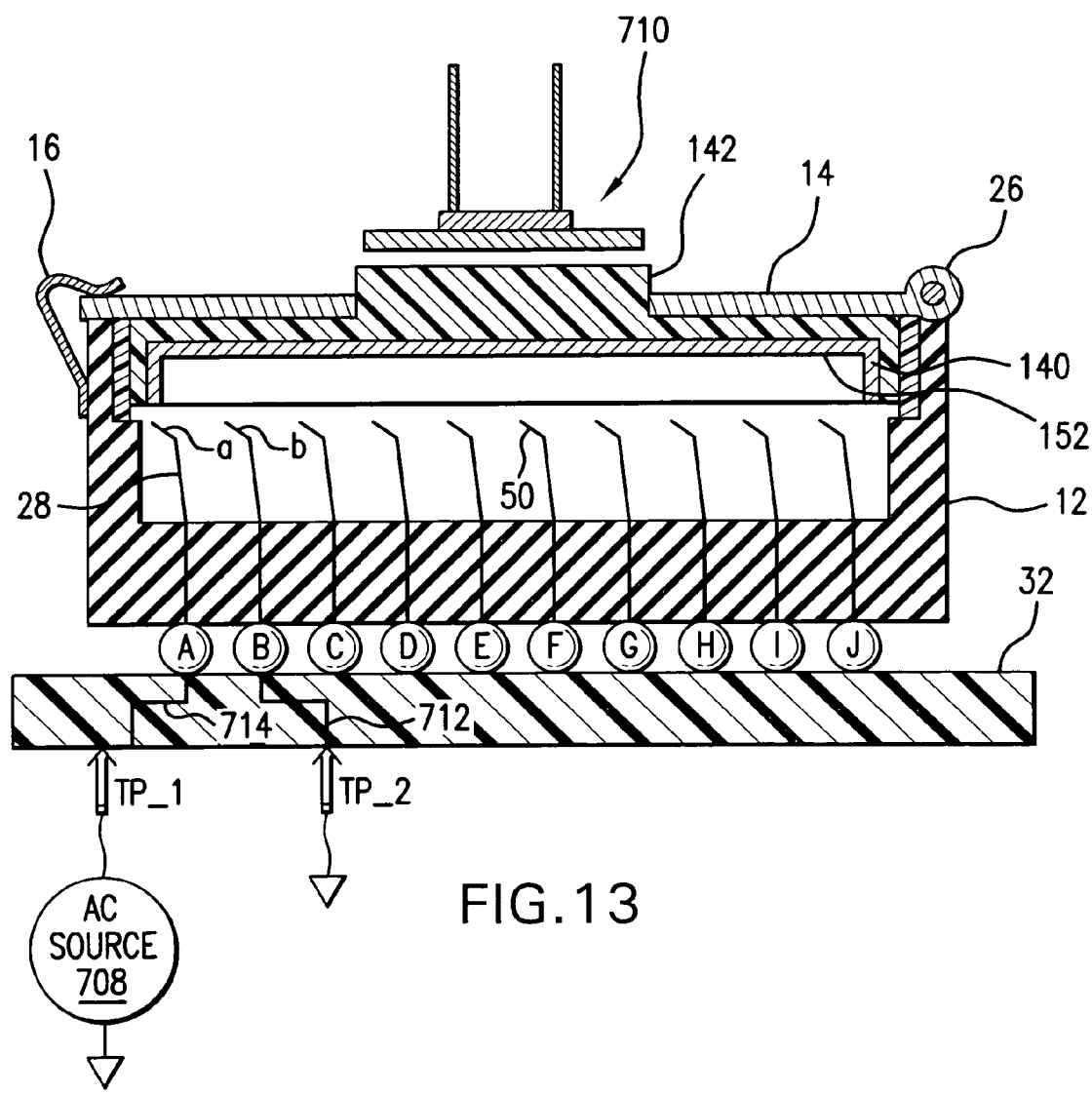
FIG. 13 illustrates an exemplary embodiment of a testable shipping and handling cover for enabling testing continuity of electrical paths through a socket connector of a circuit assembly mated with a socket, with a capacitive lead-frame test assembly coupled to the testable shipping and handling cover.

FIG. 13 illustrates the testable shipping and handling cover 140 in the socket 12, 202 on circuit assembly 32 with a capacitive sense plate and signal buffer 710 coupled to the shipping and handling pick-and-place target 142. The coupling between the capacitive sense plate that is positioned above the cover during testing is not an important parameter as long as it is larger relative to the typical value of each sense capacitor. It may be in the 10–100 pF range, making it approximately 1,000–10,000 times the value of a typical sense capacitor, which means effectively it degrades the sense capacitor measurement by a negligible amount and is insensitive to variability of cover thickness and dielectric constant. The testable shipping and handling cover 140 may be formed by simply adding a conductive layer to the under side of a typical shipping and handling cover 40.

To prepare for test, a capacitive lead-frame test assembly 710 is capacitively (this may also or alternatively include ohmic connection) coupled to the testable cover 140. The capacitive lead frame assembly 710 may contain a buffer. The nodes of the circuit assembly 300 that are coupled to contacts A–J of the socket under test 12 are coupled to a number of test probes (e.g., TP_1, TP_2, etc.). By way of example, the test probes shown in FIG. 13 may be included in a "bed of nails" test fixture, such as the Agilent Technologies, Inc. 3070 tester.

After preparing the circuit assembly 300 for test, one or more nodes of the circuit assembly are stimulated (e.g., via an AC signal source 708), while other nodes of the circuit assembly are preferably grounded (to reduce noise and extraneous signal pickup). An exemplary test sequence might then commence with the stimulation of node 714 while all other nodes of the circuit assembly 300 are grounded.

In this embodiment, the sense capacitors (Ca, Cb, etc.) are the capacitors formed between each of the ends 50 of the socket pins 28 and the conductive coating 152 of the testable shipping and handling cover 140. These sense capacitors (Ca, Cb, etc.) are substantially equivalent in this embodiment to C1–12 of the test devices 300, 500 in FIGS. 9–11. The relative capacitance of the different sense capacitors (Ca, Cb, etc.) between the cover plate 152 and the top of the socket pins 150 are substantially equivalent across the array of pins 28 for the socket. The capacitance (Cab, etc.) between neighboring socket pins 28 is substantially equivalent in this embodiment to C13–18 of the test device 500 in FIGS. 10–11. The capacitance Cab between neighboring socket pins 28 are substantially matched across the array of socket pins 28.

At this point of the test, assume that the values of capacitors Ca and Cb (capacitance between socket pin "a" and cover 140 and socket pin "b" and cover 140, respectively) are Ca=C and Cb=C. Assume that the value of Cab (capacitance between socket pin "a" and socket pin "b") is Cab=10C. With the foregoing assumptions, the apparatus shown in FIG. 13 may be reduced to the equivalent circuit shown in FIG. 14.

Figure 15:
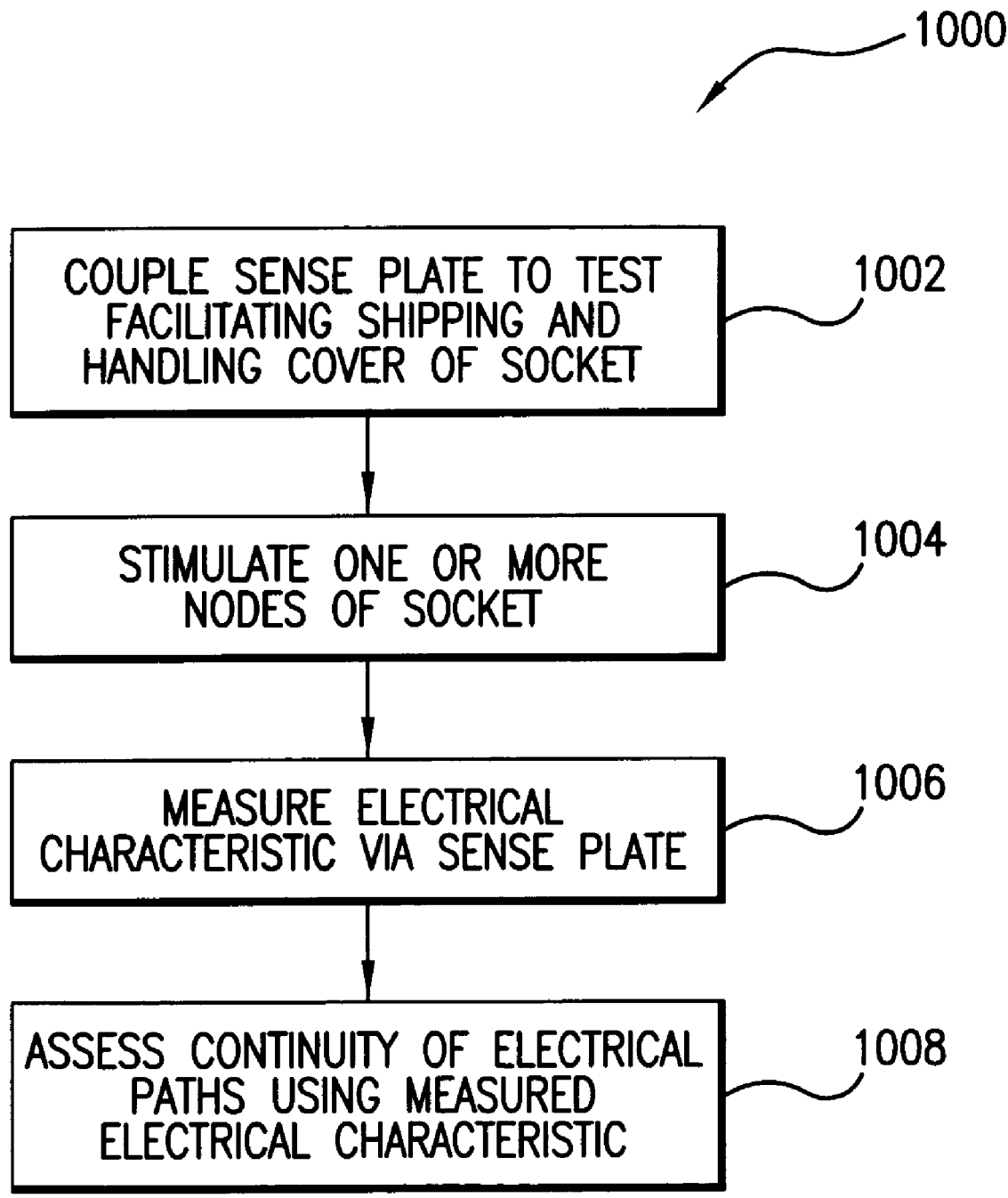
FIG. 15 illustrates a flow chart for an exemplary method for testing continuity of electrical paths through a socket connector of a circuit assembly.

FIG. 15 illustrates an equivalent circuit for the apparatus of FIG. 13 during one portion of a test. If the socket 12 is in good condition, and is properly couple to node 714, then node 714 should be shorted to contact A of the socket 12, and node 712 should be shorted to contact B of the socket 12. Given the potential at contact B is zero, the capacitance seen at the sense plate 710 should be equal to C±∈. By way of example, the capacitance seen at sense plate 710 may be derived by measuring the current flow through sense plate 710 using a meter.

Assume now that socket 12 is faulty, or is not properly coupled to node 714, such that an open exists between node 714 and contact A. This open will result in a small capacitance being place in series with capacitor Ca, thus reducing the capacitance seen at sense plate 710. For example, if the value of Ca or C is 15 pF, and the capacitance contributed by the open is 1 fF, then the capacitance seen at sense plate 710 will be approximately 0.94 fF. This change in the capacitance seen at sense plate 710 (from 15 fF to 0.94 fF), if detectable by the sensitivity of the capacitive sense plate 710 (and if greater than ∈), can be used to determine that an open exists in the electrical path of contact A.

Figure 14:
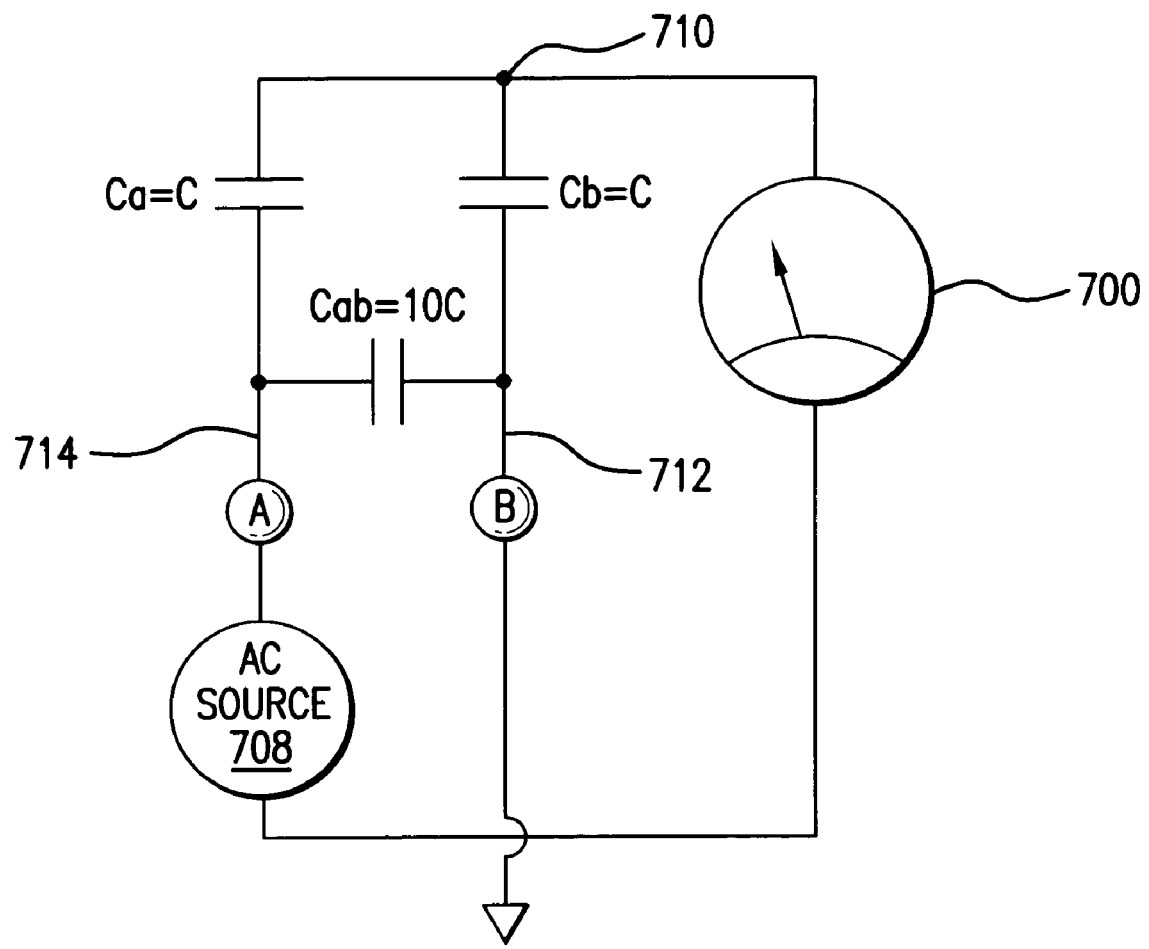
FIG. 14 illustrates an equivalent circuit for apparatus of FIG. 13 during one portion of a test.

Now assume that the socket 12 is faulty, or is not properly coupled to node 712, such that an open exists between node 712 and contact B. With contact B ungrounded, coupling capacitance Cab is now placed in series with capacitance Cb. If Cab is much larger than Cb (e.g., an order of magnitude larger, as shown in FIG. 14), then the capacitance seen at sense plate 710 will be approximately Ca+Cb (or 2*C in FIG. 14).

Finally, assume that the socket 12 is faulty, or is not properly coupled to both of nodes 714 and 712, such that opens exist in the electrical paths of both contacts A and B. In this case, the capacitance seen at the sense plate 710 should be near zero. Thus, if there is an open in the electrical path of contact A, it is difficult to assess whether there is also an open in the electrical path of contact B. However, stimulation of node 714 alone does provide a means for diagnosing whether an open exists in the electrical path of contact A or contact B.

A test of the circuit assembly 300 and socket 12 may continue with the sequential stimulation of the other nodes connected to other test probes.

FIG. 15 illustrates a method 1000 for testing continuity of electrical paths through a circuit assembly using any of the above-described test devices or techniques (as well as others). The method 1000 commences with the coupling 1002 of a sense plate to a test facilitating shipping and handling cover mated to a socket. Although, this coupling is described for illustration purposes herein as capacitive, the sensor plate may be coupled by other means, such as ohmic contact. One or more nodes of the socket are then stimulated 1004, and an electrical characteristic is measured 1006 via the sensor plate coupled to the shipping and handling cover. The measured electrical characteristic is then compared with at least one threshold to assess continuities of electrical paths through the circuit assembly 1008.

While particular embodiments have been disclosed herein to illustrate and teach the invention, other embodiments are also anticipated. For example, the present testing techniques provide for testing the continuity of the circuit assembly, the contact of the socket and circuit assembly, and the internal electrical continuity of the socket without having to remove the protective shipping and handling cover of the socket. The internal electrical continuity of the socket itself prior to attachment to a circuit assembly may also be tested by stimulating contacts of the socket, rather than stimulating contacts of the circuit assembly. It may be desirable for testing of large sockets, complex sockets, sockets with internal circuitry, or sockets prone to failure prior to attaching them to a printed circuit assembly.

The teachings herein, may also be used to perform other tests of sockets or circuit assemblies with sockets besides electrical continuity, such as determining attachment of specific sockets at specific socket locations on a circuit assembly comprising more than one socket or determining if sockets are attached in the appropriate orientation on the circuit assembly. Also, the electrical continuity between more than one socket on a circuit assembly may be tested simultaneously using the teachings of the present invention. All of the above testing scenarios are within the scope of these teachings and anticipated by the inventor.

Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims. The appended claims are intended to be construed to include such variations, except as limited by the prior art.

What is claimed is:

1. A device for testing continuity of electrical paths through an integrated circuit socket of a circuit assembly, comprising:
    a shipping and handling cover, having a top side and a bottom side, configured to removably mate with the integrated circuit socket of the circuit assembly; and
    a conductive layer on the bottom side of the shipping and handling cover, wherein the shipping and handling cover is configured to capacitively couple with electrical paths through the integrated circuit socket of a circuit assembly.

2. A device for testing continuity of electrical paths through an integrated circuit socket of a circuit assembly, comprising:
    a shipping and handling cover, having a top side and a bottom side, configured to removably mate with the integrated circuit socket of the circuit assembly; and
    a conductive layer on the bottom side of the shipping and handling cover, wherein the shipping and handling cover is configured to capacitively couple with a capacitive sense plate of a tester.

3. An apparatus for testing continuity of electrical paths through an integrated circuit socket of a circuit assembly, comprising:
    a test facilitating shipping and handling cover configured to removably mate within the socket and capacitively couple to electrical paths through socket;
    a capacitive sense plate configured to capacitively couple with the test facilitating shipping and handling cover; and
    a tester configured to stimulate nodes on the circuit assembly coupled to the electrical paths through the integrated circuit socket of the circuit assembly and measure electrical characteristics of the integrated circuit socket sensed by the capacitive sense plate.

4. An apparatus in accordance with claim 3, wherein the tester is further configured to compare the measured electrical characteristic to at least one threshold to assess continuities of electrical paths through the integrated circuit socket of a circuit assembly.

5. A method for testing continuity of electrical paths through an integrated circuit socket while a removably matable shipping and handling cover is removably inserted within the socket, comprising:
    capacitively coupling contacts of the socket to a conductive layer of a shipping and handling cover;
    coupling a capacitive sense plate to the removably matable shipping and handling cover;
    stimulating one or more nodes of the socket;
    measuring an electrical characteristic; and
    comparing the measured electrical characteristic to at least one threshold to assess continuities of electrical paths through the socket.

6. The method of claim 5, wherein the measured electrical characteristic is capacitance.

* * * * *

UNITED STATES PATENT AND TRADEMARK OFFICE
CERTIFICATE OF CORRECTION

| | | |
|---|---|---|
| PATENT NO. | : 7,068,039 B2 | Page 1 of 1 |
| APPLICATION NO. | : 10/834449 | |
| DATED | : June 27, 2006 | |
| INVENTOR(S) | : Parker | |

It is certified that error appears in the above-identified patent and that said Letters Patent is hereby corrected as shown below:

On the Title page, in item (56), under "U.S. Patent Documents", in column 1, line 1, delete "2/1896" and insert --3/1896 --, therefor.

Signed and Sealed this

Nineteenth Day of December, 2006

JON W. DUDAS
*Director of the United States Patent and Trademark Office*